(12) United States Patent
Abo et al.

(10) Patent No.: US 8,492,281 B2
(45) Date of Patent: Jul. 23, 2013

(54) LIQUID COMPOSITION, METHOD OF PRODUCING SILICON SUBSTRATE, AND METHOD OF PRODUCING LIQUID DISCHARGE HEAD SUBSTRATE

(75) Inventors: Hiroyuki Abo, Tokyo (JP); Taichi Yonemoto, Isehara (JP); Shuji Koyama, Kawasaki (JP); Kenta Furusawa, Yokohama (JP); Keisuke Kishimoto, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/556,991

(22) Filed: Jul. 24, 2012

(65) Prior Publication Data

US 2012/0289055 A1    Nov. 15, 2012

Related U.S. Application Data

(62) Division of application No. 13/014,647, filed on Jan. 26, 2011, now abandoned.

(30) Foreign Application Priority Data

Jan. 28, 2010 (JP) .................. 2010-017006

(51) Int. Cl.
*H01L 21/311* (2006.01)

(52) U.S. Cl.
USPC .... 438/700; 438/689; 438/719; 257/E21.268; 257/E21.279

(58) Field of Classification Search
USPC .................. 438/689, 700, 719; 257/E21.268, 257/E21.279
See application file for complete search history.

(56) References Cited

U.S. PATENT DOCUMENTS

| | | | |
|---|---|---|---|
| 5,883,012 A * | 3/1999 | Chiou et al. | 438/748 |
| 2008/0099717 A1* | 5/2008 | Stinson et al. | 252/79.1 |
| 2009/0082240 A1 | 3/2009 | Nukui | |

* cited by examiner

*Primary Examiner* — Julia Slutsker
(74) *Attorney, Agent, or Firm* — Canon U.S.A., Inc., IP Division

(57) ABSTRACT

A liquid composition used to carry out crystal anisotropic etching of a silicon substrate provided with an etching mask formed of a silicon oxide film with the silicon oxide film used as a mask includes cesium hydroxide, an alkaline organic compound, and water.

4 Claims, 4 Drawing Sheets

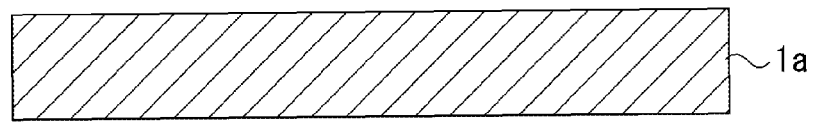
FIG. 1A
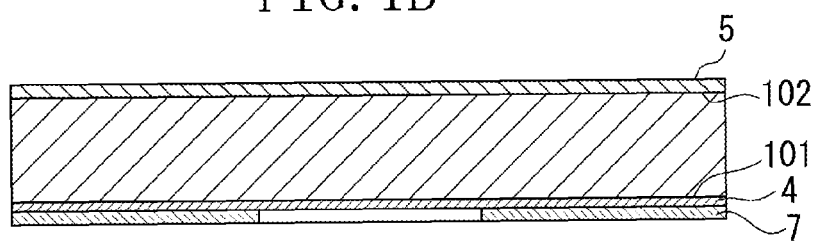
FIG. 1B
FIG. 1C
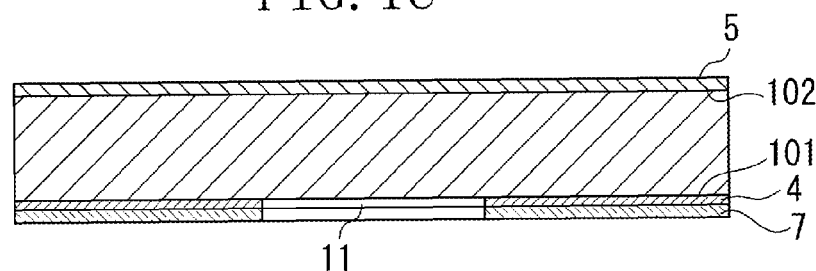
FIG. 1D
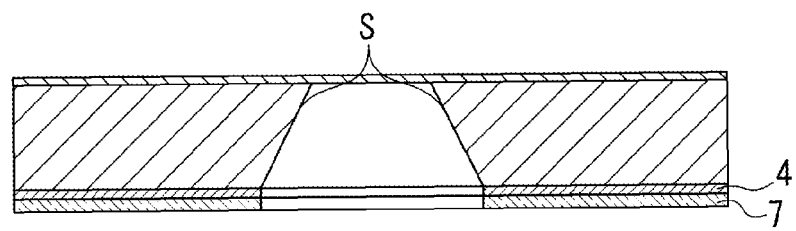
FIG. 1E
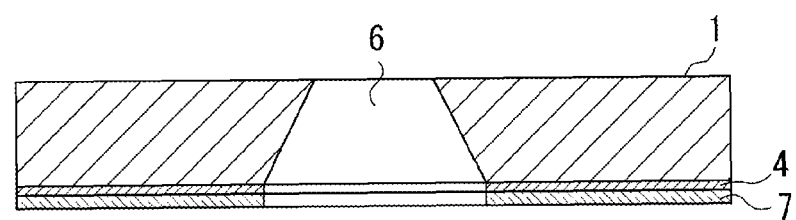

LIQUID COMPOSITION, METHOD OF PRODUCING SILICON SUBSTRATE, AND METHOD OF PRODUCING LIQUID DISCHARGE HEAD SUBSTRATE

CROSS REFERENCE TO RELATED APPLICATIONS

This application is a Divisional of U.S. patent application Ser. No. 13/014,647 filed Jan. 26, 2011, which claims priority to Japanese Patent Application No. 2010-017006 filed Jan. 28, 2010, both of which are hereby incorporated by reference herein in their entireties.

BACKGROUND OF THE INVENTION

1. Field of the Invention

The present invention relates to a liquid composition, a method of producing a silicon substrate, and a method of producing a liquid discharge head substrate.

2. Description of the Related Art

In recent years, various silicon devices have been applied to a variety of devices such as liquid discharge heads, thermosensors, pressure sensors, and acceleration sensors with developments of micromachining technologies. These various silicon devices are desired to satisfy various demands on production cost reduction, miniaturization, and higher functions. For satisfying these demands, fine processing technologies which are micromachining technologies are used in the production of these silicon devices. In these micromachining technologies, anisotropic silicon wet etching technologies are used to form a desired structure and, for example, a method is used in which silicon is etched by using an alkaline etching solution which is an aqueous solution of potassium hydroxide or tetramethylammonium hydroxide.

However, because a long time is required for anisotropic silicon wet etching, it is desired to shorten the time required for silicon etching to improve productivity from the reason that production time is determined by the etching time. Japanese Patent Application Laid-Open No. 2009-206335 discusses that an etching solution containing an alkaline organic compound, sodium hydroxide, and a silicon-containing compound is used to improve silicon etching rate.

However, there is a possibility that the liquid composition discussed in Japanese Patent Application Laid-Open No. 2009-206335 fails to facilitate the formation of a desired shape when it is applied to a method of producing a silicon device using a silicon oxide film as an etching mask because a difference in etching rate between silicon oxide and silicon is insufficient.

SUMMARY OF THE INVENTION

The present invention is directed to an etching liquid composition which has a high etching rate, is reduced in the corrosion of a silicon oxide film, and enables anisotropic selective etching of silicon in anisotropic silicon etching.

According to an aspect of the present invention, a liquid composition used to carry out crystal anisotropic etching of a silicon substrate provided with an etching mask formed of a silicon oxide film with the silicon oxide film used as a mask includes cesium hydroxide, an alkaline organic compound, and water.

According to an exemplary embodiment of the present invention, an isotropic silicon etching liquid composition can be provided which has a high silicon etching rate and is reduced in the ability to etch a silicon oxide film used as an etching mask. This etching liquid composition can contribute to the productivity of a production process using silicon fine processing technologies.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to describe the principles of the invention.

FIGS. 1A to 1E are sectional views illustrating a method of producing a silicon substrate according to an exemplary embodiment of the present invention.

DESCRIPTION OF THE EMBODIMENTS

Various exemplary embodiments, features, and aspects of the invention will be described in detail below with reference to the drawings.

A liquid composition used to carry out crystal anisotropic etching of silicon according to an exemplary embodiment of the present invention includes cesium hydroxide, an alkaline organic compound, and water.

Though the liquid composition mainly includes an aqueous solution containing cesium hydroxide, an alkaline organic compound, and water, mixing of other liquid components is not excluded. Any material may be used as an additional component to be added to the liquid composition insofar as it does not impair the etching characteristics of each of the above cesium hydroxide and alkaline organic compound.

Any material may be used as the alkaline organic compound according to the present exemplary embodiment insofar as it is a compound exhibiting desired alkalinity allowing the etching of silicon, and an alkali compound giving desired etching characteristics may be used. Examples of these alkali compounds include tetramethylammonium hydroxide (TMAH) and tetraethylammonium hydroxide hydride (TEAH). Tetramethylammonium hydroxide is given as a preferable example. With regard to the concentration of the alkaline organic compound in the liquid composition, the alkaline organic compound is preferably used in such a manner that its concentration is 4% by weight to 25% by weight inclusive based on the total weight of the liquid composition. The concentration of the alkaline organic compound is preferably 5% by weight or more in view of, particularly, maintaining necessary etching ability for a long period of time and is preferably 25% by weight or less in view of particularly increasing necessary etching rate.

Further, cesium hydroxide is used as the inorganic alkali compound to be mixed with the alkaline organic compound.

Further, the ratio by weight of cesium oxide to the liquid composition is preferably 1% by weight to 60% by weight inclusive. The ratio by weight of cesium oxide is preferably 1% by weight or more with the view of sufficiently improving the silicon etching rate and is preferably 40% by weight or less in consideration of, for example, cost performance.

The ratio of the amount of cesium hydroxide and alkaline organic compound to the amount of water in the liquid composition is preferably 80 percent or more, more preferably 95 percent or more and even more preferably 98 percent or more, to allow cesium hydroxide and alkaline organic compound to function efficiently.

The etching liquid composition according to the present exemplary embodiment may be preferably used as the etching solutions in the productions of various silicon devices, such as liquid discharge heads, pressure sensors, and acceleration sensors, in the fields of microelectromechanical system (MEMS) involving a silicon wet etching process.

Figure 3:
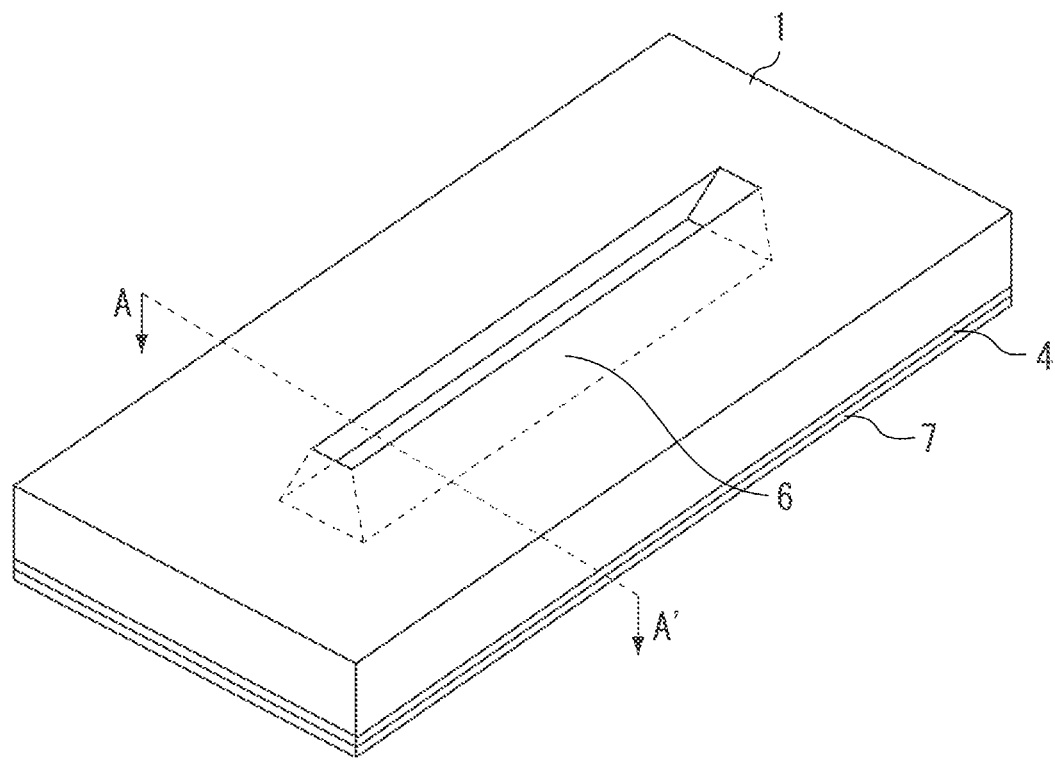
FIG. 3 is a perspective view illustrating an example of a silicon substrate according to an exemplary embodiment of the present invention.

FIG. 3 is a perspective view illustrating a monocrystal silicon substrate 1 having a {100} plane azimuth with a through-port 6 formed thereon by anisotropic etching using a silicon oxide film 4 as a mask. The through-port 6 is formed in such a manner as to be narrower toward the front surface from the back surface of the silicon substrate 1. An oxide film 4 and a resin layer 7 are formed on the back surface of the silicon substrate 1.

A method of forming a through-port on a monocrystal silicon substrate will be described with reference to FIGS. 1A to 1E.

FIGS. 1A to 1E are sectional views each illustrating a section perpendicular to the substrate 1 taken along line A-A' in FIG. 3 and are typical sectional views illustrating a fundamental process of producing a silicon substrate with a through-port formed using an etching liquid composition according to the present exemplary embodiment.

A mother material 1a of silicon is prepared as illustrated in FIG. 1A. In this case, the mother material 1a has a {100} principal plane.

Then, as illustrated in FIG. 1B, the silicon oxide film 4 is formed on the back surface 101, which is another surface of the silicon mother material 1a illustrated in FIG. 1A. The silicon oxide film 4 may be formed as a deposition film by the chemical vacuum deposition (CVD) method or may be formed on the surface layer by thermal oxidation of the silicon mother material 1a. The substrate 1 of silicon (referred to also as a silicon substrate 1) with the oxide film 4 formed on its back surface 101 is thus obtained. As to the condition of the mother material 1, an oxide film 5 is formed also on the front surface 102 when the mother material 1 is thermally oxidized.

At this time, the resin layer 7 patterned to etch the silicon oxide film 4, which is to be a mask in the formation of the through-port 6, is formed in advance on the back surface 101 of the silicon substrate 1. This resin layer 7 may be formed of, for example, a polyether amide.

Then, as illustrated in FIG. 1C, the silicon oxide film 4 is etched by using the resin layer 7 as a mask to form an opening portion 11 in the oxide film 4.

Then, as illustrated in FIG. 1D, silicon of the substrate 1 is etched by using the etching liquid composition of the present exemplary embodiment from the opening portion 11. The {100} plane of silicon is etched preferentially and the etching advances towards the front surface 102 of the substrate 1. The oxide film 5 on the front surface 102 is etched by a liquid composition at a low rate and the etching is finished just before the oxide film 5 is exposed as a region to be etched. A {111} plane S appears on the side surface and the through-port 6 penetrating through the substrate 1 is formed.

Then, as illustrated in FIG. 1E, the silicon oxide film 5 on the front surface of the silicon substrate 1 is removed to obtain the substrate 1 put into the state illustrated in FIG. 3.

After that, the resin layer 7 and the oxide film 4 may be removed by, for example, etching.

Figure 4:
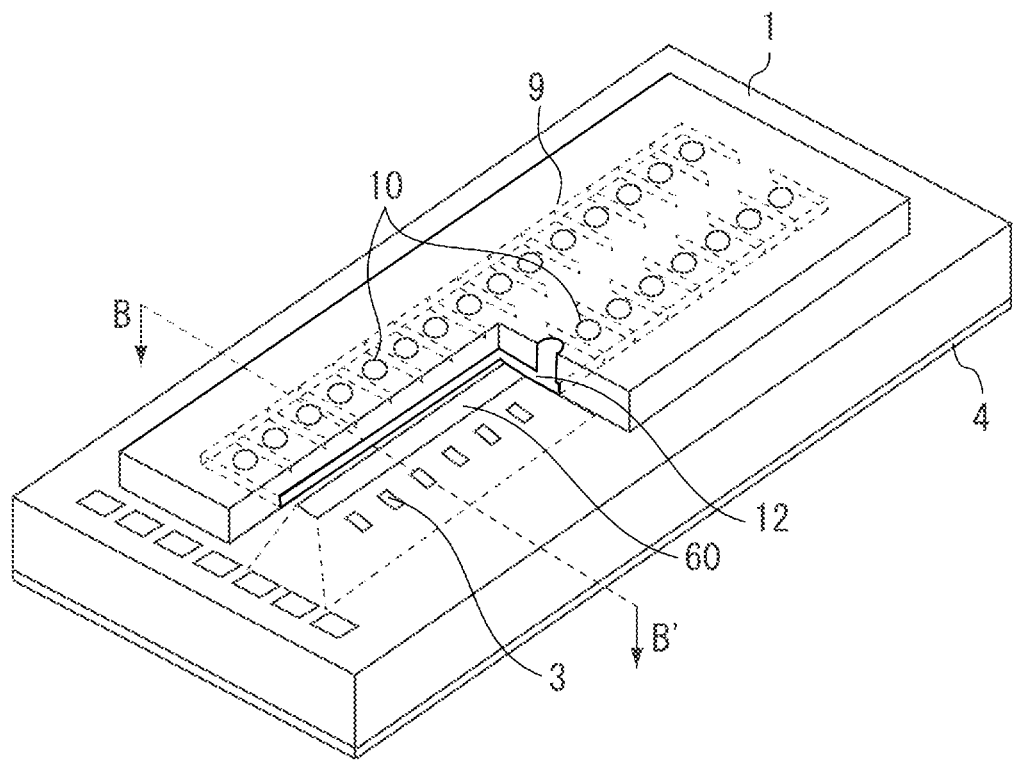
FIG. 4 is a perspective view illustrating an example of a liquid discharge head according to an exemplary embodiment of the present invention.

FIG. 4 is a typical perspective view illustrating an example of a liquid discharge head according to an exemplary embodiment of the present invention and is also a partly broken view illustrating the inside structure. As illustrated in FIG. 4, the liquid discharge head is provided with a silicon substrate 1 as the liquid discharge head substrate with energy generation elements 3 formed in two rows at fixed pitches. A flow path 12 and liquid discharge ports 10 opened above the energy generation element 3 are formed on the substrate 1 by using a coating resin layer 9 constituting a flow path forming member, thereby forming the upper liquid flow path communicating with each discharge port 10 from a liquid supply port 60, which is formed by anisotropic silicon etching and opened from a space between the two rows of energy generation elements 3. This liquid discharge head discharges liquid droplets from the discharge ports 10 when pressure enough to energize the energy generation elements 3 is applied to the liquid filled in the flow path through the supply port 60. Further, the oxide film 4 is formed on the back surface of the silicon substrate 1. The liquid discharge head may be applied to inkjet recording heads configured to perform recording by sticking ink to a recording medium or inkjet heads for producing color filters.

A method of producing the liquid discharge head substrate will be described with reference to FIGS. 2A to 2E.

FIGS. 2A to 2E are sectional views each illustrating a section perpendicular to the substrate taken along line B-B' in FIG. 4 and typical sectional views illustrating a fundamental step for producing a liquid discharge head according to an exemplary embodiment of the present invention. Though the formations of the flow path and discharge port, which will be described below, are inessential processes, explanations will be made taking, as an example, a production method in which the flow path and discharge port are formed according to the production of the liquid discharge head substrate in the present exemplary embodiment.

Figure 2A:
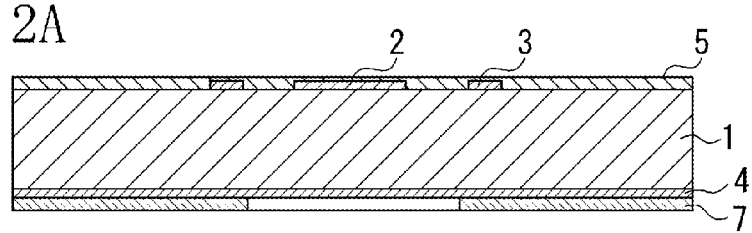
FIGS. 2A to 2E are sectional views illustrating a method of producing a liquid discharge head according to an exemplary embodiment of the present invention.

A sacrifice layer 2 and a plurality of energy generation elements 3, such as thermal resistances that generate the energy utilized to discharge liquid, are arranged on the front surface, which is the first surface, of the monocrystal silicon substrate 1 having a {100} plane azimuth as illustrated in FIG. 2A. An insulating film (not illustrated), such as a thermal oxidation film, is formed between the energy generation element 3 and the silicon part of the silicon substrate 1. Further, a silicon oxide film 4, which is to be a mask used to form the ink supply port 60, is formed on the back surface, which is the second surface, of the substrate 1. Wiring of the energy generation element 3 and a semiconductor device used to drive the energy generation element 3 are not illustrated. The sacrifice layer 2 and other elements and wirings are covered with the protective film 5. The energy generation element 3 may be covered. The sacrifice layer 2 is formed of, for example, aluminum or polysilicon and the protective film 5 is formed of, for example, an oxide, nitride, or carbide of silicon. The resin layer 7 used to etch the silicon oxide film 4 is formed on the back surface of the substrate 1 in advance by patterning.

Figure 2B:
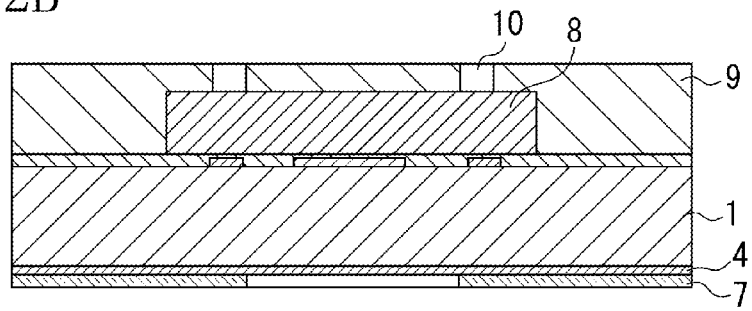

Then, as illustrated in FIG. 2B, a positive resist 8, which is to be a patterning material of the flow path 12, is applied to the substrate 1 illustrated in FIG. 1A and then exposed to light and developed. Next, a coating resin layer 9 is applied by, for example, spin coating, exposed to, for example, ultraviolet light or Deep UV and developed to form the discharge port 10. This step is not necessarily carried out in this stage.

Figure 2C:
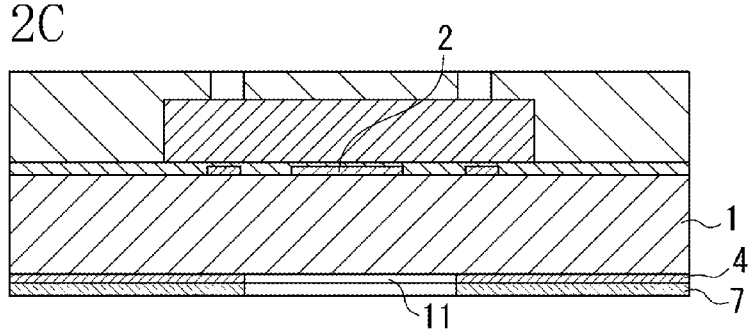

Then, as illustrated in FIG. 2C, the opening portion 11 is formed by wet etching using the resin layer 7 as a mask.

Figure 2D:
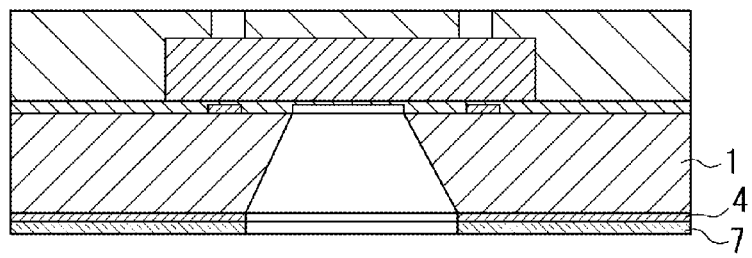

Then, as illustrated in FIG. 2D, silicon of the substrate 1 is etched by using the etching liquid composition according to an exemplary embodiment of the present invention. The region to be etched spreads towards the front surface of the substrate 1 and reaches the sacrifice layer 2. If the sacrifice layer 2 can be rapidly dissolved in the liquid composition of the present exemplary embodiment, the etching is allowed to continue. The supply port 60 penetrating through the substrate 1 is formed in the above-described manner.

Thereafter, the resin layer 7 is removed. However, this step may be performed according to the need.

Figure 2E:
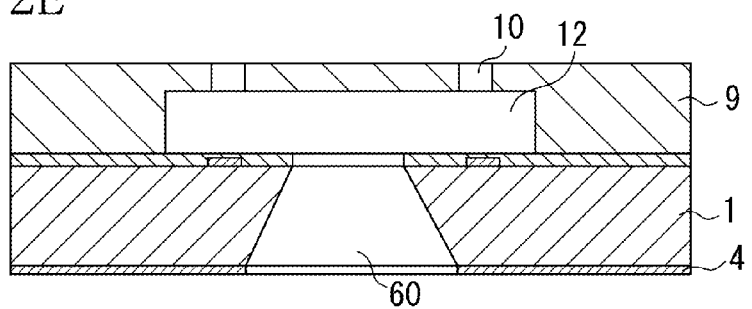

Then, the positive resist 8, which is the patterning material, is removed after the protective film 5 is etched as illustrated in FIG. 2E, and the coating resin layer 9, which is the material covering the patterning material, is thermally cured.

The silicon substrate 1 with nozzle portions formed by the above steps is cut/separated into chips by a dicing saw and the like to obtain a liquid discharge head. After that, electrical connection is made for driving the energy generation elements 3 and then, a support member (tank case) is connected to supply ink. The oxide film may be removed according to the need before the back surface is connected to the support member.

Hereinafter, exemplary embodiments of the present invention will be described in more detail by way of Examples 1 to 6. However, the present invention is not limited to those examples.

The etching liquid compositions of Examples 1 to 6 in Table 1 were prepared as anisotropic silicon etching liquid compositions to examine their properties.

EXAMPLE 1

In Example 1, an aqueous solution (anisotropic silicon etching liquid composition) containing 5% by weight of tetramethylammonium hydroxide (hereinafter abbreviated as TMAH), which is an alkaline organic compound, and 10% by weight of cesium hydroxide (hereinafter abbreviated as CsOH) as an inorganic alkali compound was prepared. Then, a silicon wafer sample used to measure an etching rate was dipped at 80° C. for one hour in the etching liquid composition of Example 1. The wafer sample was rinsed with ultrapure water, then dried, and the etching amounts of the wafer sample in the directions of the 100 and 111 planes of silicon were measured to determine an etching rate. A wafer on which a silicon oxide film was formed by using an etching liquid composition having the same composition was used to determine the etching rate of the silicon oxide film in the same manner as above.

EXAMPLE 2

In Example 2, an aqueous solution containing 5% by weight of TMAH and 1% by weight of CsOH was prepared as an etching liquid composition. Then, a silicon wafer sample and a wafer on which a silicon oxide film was formed were used to carry out etching in the same condition as in Example 1 to examine a silicon etching rate and also to measure the etching rate of the silicon oxide film.

EXAMPLE 3

In Example 3, an aqueous solution containing 25% by weight of TMAH and 40% by weight of CsOH was prepared as an etching liquid composition. Then, each etching rate was measured in the same manner as in Example 1.

EXAMPLE 4

In Example 4, an aqueous solution containing 5% by weight of TMAH and 40% by weight of CsOH was prepared as an etching liquid composition. Then, each etching rate was measured in the same manner as in Example 1.

EXAMPLE 5

In Example 5, an aqueous solution containing 25% by weight of TMAH and 1% by weight of CsOH was prepared as an etching liquid composition. Then, each etching rate was measured in the same manner as in Example 1.

EXAMPLE 6

In Example 6, an aqueous solution containing 2% by weight of TMAH and 1% by weight of CsOH was prepared as an etching liquid composition. Then, each etching rate was measured in the same manner as in Example 1.

The results of the measurement of etching rate of the etching liquid compositions of Examples 1 to 6 are illustrated in Table 1.

COMPARATIVE EXAMPLE 1

For comparison, potassium hydroxide (hereinafter abbreviated as KOH) was used as the inorganic alkali compound, which was to be added to the alkaline organic compound, as illustrated in Table 2 to prepare an anisotropic silicon etching liquid composition, thereby examining properties of the composition.

An aqueous solution containing 25% by weight of TMAH and 40% by weight of KOH was prepared as an etching liquid composition. Then, a silicon wafer sample and a wafer on which a silicon oxide film was formed were used to carry out etching using this etching liquid composition in the same condition as in Example 1 to examine a silicon etching rate and silicon oxide film etching rate. The results are illustrated in Table 2.

COMPARATIVE EXAMPLE 2

For comparison, potassium hydroxide (hereinafter abbreviated as KOH) was used as the inorganic alkali compound, which was to be added to the alkaline organic compound, as illustrated in Table 2 to prepare an anisotropic silicon etching liquid composition, thereby examining properties of the composition. Specifically, an aqueous solution containing 5% by weight of TMAH and 10% by weight of KOH was prepared as an etching liquid composition. Then, a silicon wafer sample and a wafer on which a silicon oxide film was formed were used to carry out etching using this etching liquid composition in the same condition as in Example 1 to examine a silicon etching rate and silicon oxide film etching rate. The results are illustrated in Table 2.

As illustrated in Table 1, it was confirmed that when the etching liquid compositions of Examples of the present exemplary embodiment were used, silicon could be selectively etched at a higher etching rate than a silicon oxide film.

The compositions of the Examples each have a significantly lower silicon oxide film etching rate than the compositions of Comparative Examples. Therefore, the liquid compositions of the Examples ensure that silicon can be more selectively etched than a silicon oxide film.

This reason is that the liquid compositions of the Examples each contain cesium ions, which have a large ion radius and a low diffusing speed in a silicon oxide film as compared with the liquid compositions of the Comparative Examples containing potassium ions having a high diffusing speed in a silicon oxide film.

According to the exemplary embodiments of the present invention, as mentioned above, an isotropic silicon etching liquid composition can be provided, which has a high etching rate and small capability of etching a silicon oxide film which is frequently used for an etching mask. Further, the use of the etching liquid composition according to the exemplary embodiment of the present invention can improve silicon fine processing efficiency.

Accordingly, the present invention can be widely applied to technical fields relating to fine processing of silicon wafers and the like.

TABLE 1

| | Silicon etching liquid composition | | | Silicon etching rate | | Silicon oxide film |
|---|---|---|---|---|---|---|
| | Organic alkali compound TMAH (wt %) | Inorganic alkali compound CsOH (wt %) | Etching temperature (° C.) | 100 plane (μm/h) | 111 plane (μm/h) | etching rate (μm/h) |
| Example 1 | 5 | 10 | 80 | 80.4 | 9.1 | 0.025 |
| Example 2 | 5 | 1 | 80 | 64.1 | 7.1 | 0.028 |
| Example 3 | 25 | 40 | 80 | 33.2 | 3.9 | 0.034 |
| Example 4 | 5 | 40 | 80 | 83.9 | 11.8 | 0.030 |
| Example 5 | 25 | 1 | 80 | 24.1 | 3.0 | 0.010 |
| Example 6 | 2 | 1 | 80 | 37.1 | 5.4 | 0.022 |

TABLE 2

| | Silicon etching liquid composition | | | Silicon etching rate | | Silicon oxide film |
|---|---|---|---|---|---|---|
| | Organic alkali compound TMAH (wt %) | Inorganic alkali compound KOH (wt %) | Etching temperature (° C.) | 100 plane (μm/h) | 111 plane (μm/h) | etching rate (μm/h) |
| Comparative Example 1 | 25 | 40 | 80 | 32.4 | 5.3 | 2.1 |
| Comparative Example 2 | 5 | 10 | 80 | 78.5 | 12.3 | 0.305 |

Next, a method of producing a silicon device by using the etching liquid composition according to an exemplary embodiment of the present invention will be described in detail, though the present invention is not limited to the following Examples at all.

(Example in which a Through-port is Formed in a Silicon Substrate)

An example relating to a method of forming a through-port in a silicon substrate by using an etching liquid composition according to an exemplary embodiment of the present invention will be described in detail with reference to FIGS. 1A to 1E.

FIGS. 1A to 1E are typical sectional views illustrating a fundamental process of producing a silicon substrate provided with a through-port formed using an etching liquid composition according to an exemplary embodiment of the present invention.

A silicon mother material 1a was prepared as illustrated in FIG. 1A.

Next, as illustrated in FIG. 1B, a silicon oxide film 4 or 5 was formed on each side of the silicon mother material 1a illustrated in FIG. 1A by the thermal oxide formation method. As to the condition of the formation, thermal treating temperature was 1000° C., treating time was 60 minutes and $H_2/O_2$ mixture gas was used. Thereafter, a resin layer 7 was formed on the back surface of the silicon substrate 1 by patterning. A polyether amide was used for the resin layer 7.

Then, as illustrated in FIG. 1C, the silicon oxide film 4 formed on the back surface of the silicon substrate 1 was etched by Buffered Hydrofluoric Etch (BHF) by using the resin layer 7 as a mask to form an opening portion 11. In this case, the opening portion 11 can be formed using a dry etching apparatus utilizing reactive ionetching technologies.

Next, as illustrated in FIG. 1D, etching was carried out by using the etching liquid composition of the present exemplary embodiment to form a through-port 6. As the etching liquid composition, an anisotropic silicon etching liquid composition containing 5% by weight of alkaline organic compound TMAH and 10% by weight of CsOH as an inorganic alkali compound was prepared. The temperature of the etching solution was set to 80° C. to carry out etching. In this case, the addition of CsOH resulted in that the silicone etching rate of this anisotropic silicone etching liquid composition became 1.4 times to 1.9 times that of the anisotropic silicon etching liquid composition which singly contained TMAH but no CsOH to be added.

Next, as illustrated in FIG. 1E, the silicon oxide film 5 on the front surface of the silicon substrate 1 was removed to form a silicon substrate formed with the through-port 6.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2010-017006 filed Jan. 28, 2010, which is hereby incorporated by reference herein in its entirety.

What is claimed is:

1. A method of producing a silicon substrate, the method comprising:
    preparing a silicon substrate on which a silicon oxide film formed with an opening is formed on at least one surface of the substrate; and
    etching the substrate from the opening by using a liquid composition containing cesium hydroxide, an alkaline organic compound including tetramethylammonium hydroxide, and water as an etching solution and using the oxide film as a mask to form a through-port penetrating through the substrate, wherein a ratio by weight of the cesium hydroxide to the weight of the liquid composition is 1% by weight to 10% by weight inclusive,
    wherein a ratio by weight of the tetramethylammonium hydroxide to the weight of the liquid composition is 5% by weight to 25% by weight inclusive.

2. The method according to claim 1, wherein the surface of the silicon substrate on which the silicon oxide film is formed is a {100} plane.

3. The method according to claim 1, wherein a silicon oxide film is formed on a surface of the silicon substrate opposite the surface on which the silicon oxide film is formed.

4. The method according to claim 1, wherein the through-port is formed such that a {111} plane of the silicon substrate is exposed.

* * * * *